(12) United States Patent
Hui et al.

(10) Patent No.: US 8,089,153 B2
(45) Date of Patent: Jan. 3, 2012

(54) METHOD FOR ELIMINATING LOADING EFFECT USING A VIA PLUG

(75) Inventors: Wu Xiang Hui, Shanghai (CN); Ching-Tien Ma, Shanghai (CN); Man Hua Shen, Shanghai (CN); Chi Yu Shan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 79 days.

(21) Appl. No.: 12/637,704

(22) Filed: Dec. 14, 2009

(65) Prior Publication Data

US 2010/0133702 A1    Jun. 3, 2010

Related U.S. Application Data

(62) Division of application No. 12/135,008, filed on Jun. 6, 2008, now Pat. No. 7,655,554.

(30) Foreign Application Priority Data

Jun. 18, 2007    (CN) .......................... 2007 1 0042145

(51) Int. Cl.
*H01L 23/48* (2006.01)

(52) U.S. Cl. .......................... 257/750; 257/752; 257/758

(58) Field of Classification Search .................. 257/750, 257/752, 758, 760, 773, 774
See application file for complete search history.

(56) References Cited

U.S. PATENT DOCUMENTS

| | | |
|---|---|---|
| 6,174,781 B1 | 1/2001 | Dai et al. |
| 6,488,509 B1 | 12/2002 | Ho et al. |
| 6,898,851 B2 | 5/2005 | Nishioka et al. |
| 7,241,682 B2 | 7/2007 | Ho et al. |
| 7,655,554 B2 | 2/2010 | XiangHui et al. |
| 2005/0266691 A1 * | 12/2005 | Gu et al. ........................ 438/706 |
| 2006/0094234 A1 | 5/2006 | Soda et al. |

OTHER PUBLICATIONS

Requirement for Restriction/Election for U.S. Appl. No. 12/135,008, mailed on May 27, 2009, 9 pages.
Notice of Allowance for U.S. Appl. No. 12/135,008, mailed on Sep. 14, 2008, 8 pages.

* cited by examiner

*Primary Examiner* — Kevin M Picardat
(74) *Attorney, Agent, or Firm* — Kilpatrick Townsend and Stockton LLP

(57) ABSTRACT

Method for eliminating loading effect using a via plug. According to an embodiment, the present invention provides a method of processing an integrated circuit wherein a loading effect is reduced. The method includes a step for providing a substrate, which is characterized by a first thickness. The method also includes a stop for forming an inter metal dielectric layer overlaying the substrate. The inter metal dielectric layer is characterized by a second thickness. The method additionally includes a step for forming a first photoresist layer overlaying the inter metal dielectric layer. The first photoresist layer is associated with a first pattern. Additionally, the method includes a step for forming a first opening positioned at least partially inside the inter metal dielectric layer. The first via opening is characterized by a first depth. The method additionally includes a step for removing the first photoresist layer. The method further includes a step for forming a via plug.

10 Claims, 11 Drawing Sheets

METHOD FOR ELIMINATING LOADING EFFECT USING A VIA PLUG

CROSS-REFERENCES TO RELATED APPLICATIONS

This application claims priority to Chinese Patent No. 200710042145.8, filed Jun. 18, 2007, commonly assigned and hereby incorporated by reference for all purposes.

BACKGROUND OF THE INVENTION

The present invention is directed to integrated circuits and their processing for the manufacture of semiconductor devices. More particularly, the invention provides a method and device for the etching process for the manufacture of integrated circuits. Merely by way of example, the invention has been applied to dual-damascene formation and reduces loading effects that are typically associated with pattern diversity. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is chemical dry etching process used for the manufacture of integrated circuits in a cost effective and efficient way.

The manufacturing of integrated circuits involves various processes. For example, the processes include, inter alia, wafer growth, photolithography, doping, oxidation, deposition, etching Removal, and epitaxial growth.

Semiconductor devices and circuits are formed in wafers, which serve as substrates. Generally, single-crystal substrates, which are made from a single material with crystals formed by atoms all aligned in a specific direction. The process of waver creation usually involves creating a large ingot of semiconductor materials, aligning the ingot, removing impurities, slicing ingot into thin wafers, and polishing the sliced wafers.

Generally, photolithography process is used to define and shape specific areas of the wafer to suit particular design of integrated circuit. Usually, a layout design used to create an optical mask (or reticle pattern, depending on application). The wafer surface is usually covered with a layer of photoresist. The wafer is then exposed to light through the optical mask. After light exposure, the areas of photoresist that were exposed to light are removed using chemical process. As a result, the wafer contains both clear areas (where photoresist is removed) and areas blocked by photoresist. Next, various processes (such as etching, oxidation, diffusion, etc.) only affecting clear areas are performed. After various process are finished, photoresist materials are then removed.

Deposition is another process in semiconductor fabrication. Deposition provides connections among insulators and interconnecting layers by depositing various materials. Techniques such as chemical vapor deposition (CVD) and lower pressure CVD (LPCVD) are commonly used. For example, metals are deposited to provide low resistance interconnects, polysilicon is used as conductor, and dielectric materials are deposited to create insulating layers.

Etching is another important process in semiconductor manufacturing. Etching involves removing selected regions from the surface of a wafer using physical process, chemical process, or the combination thereof. Usually the goal of etching is to faithfully reproduce masking patterns. To achieve this goal, it is often desirable to for the etching process to be highly selective both in patterns and depth, which is often achieve through chemical dry etching.

Chemical drying etching usually involves generating reactive species in a plasma, diffusing these species to the surface of material being etched, species being absorbed, reacting of these species on the surface to form volatile by-product, absorbing or the by-product by the surface, and diffusing of the desorbed species diffusing into gas. There are many various dry-etch systems to accomplish these steps. For example, dry-etch systems include barrel etchers, downstream etchers, parallel-electrode (planar) reactor etchers, stacked parallel-electrode etchers, hexode batch etchers, magnetron ion etchers, etc.

Among various types of etching processes, dual damascene etching has been one of the most difficult. Due to the complexity associated with dual damascene, the standard for both etching and striping processes are often strict. For example, the process usually need to avoid copper exposures on via bottoms during etching and subsequent plasma photoresist stripping in order to maintain contact yield. Often, the margin for error is typically very small.

In the past, conventional techniques have been using deep ultraviolet light absorbing oxide (DUO) materials to fill via during the manufacturing process. For example, the DUO material is used in this application as a sacrifice layer. One of the challenge associated with using the DUO material is to reduce or eliminate loading effect caused by pattern diversity. Unfortunately, conventional techniques are often inadequate for many manufacturing needs of semiconductors. For example, DUO material used in conventional techniques often cause too much loading effect. These and other limitations of the conventional techniques have been overcome, at least in part, by the invention that has been fully described below.

Therefore, it is desirable to have an improved method and system for the semiconductor manufacturing process.

BRIEF SUMMARY OF THE INVENTION

The present invention is directed to integrated circuits and their processing for the manufacture of semiconductor devices. More particularly, the invention provides a method and device for the etching process for the manufacture of integrated circuits. Merely by way of example, the invention has been applied to dual-damascene formation. But it would be recognized that the invention has a much broader range of applicability.

According to an embodiment, the present invention provides a method of processing an integrated circuit wherein a loading effect is reduced. The method includes a step for providing a substrate, which is characterized by a first thickness. The method also includes a stop for forming an inter metal dielectric layer overlaying the substrate. The inter metal dielectric layer is characterized by a second thickness. The method additionally includes a step for forming a first photoresist layer overlaying the inter metal dielectric layer. The first photoresist layer is associated with a first pattern. Additionally, the method includes a step for forming a first via opening positioned at least partially inside the inter metal dielectric layer. The first via opening is characterized by a first depth. The method additionally includes a step for removing the first photoresist layer. The method further includes a step for forming a via plug. The via plug is positioned in side the first via opening. The via plug is characterized by a first plurality of dimensions. The first plurality of dimensions includes a first height and a first width. The first height is less than or equal to the first depth. Furthermore, the method includes a step for forming an oxide layer overlaying the first via opening. Additionally, the method includes a step for forming a second photoresist layer overlaying the oxide layer. The second photoresist layer is associated with a second pattern. The method also includes a step for forming a second via opening positioned at least partially inside the inter metal dielectric layer. The second via opening is characterized by second plurality of dimensions. The second plurality of dimensions includes a second depth and a second width. The second depth is less than the first depth. The second width is less then the first width. The method also includes a step for removing the via plug and the second photoresist layer.

According to another embodiment, the present invention provides a partially process integrated circuit. The partially process integrated circuit includes a substrate, which is characterized by a first dimension. The partially process integrated circuit also includes an inter metal dielectric layer overlaying the substrate. The inter metal dielectric layer includes a first via opening. The first via opening is characterized by a first depth. The partially process integrated circuit additionally includes a via plug position within the first via opening. The via plug position is characterized by a first height and a first width. The first height is less than the first depth. Additionally, the partially process integrated circuit includes a filling layer overlaying the via plug position. The filling layer includes a filling portion and a blanket portion. The filling portion is positioned within the via plug position. The blanket portion is characterized by a second width. The second width is greater than the first width.

According yet another embodiment, the present invention provides a partially process integrated circuit. The partially process integrated circuit includes a substrate, which is characterized by a first dimension. The partially process integrated circuit also includes an inter metal dielectric layer overlaying the substrate. The inter metal dielectric layer includes a first via opening. The first via opening is characterized by a first depth. The partially process integrated circuit additionally includes a via plug position within the first via opening. The via plug position is characterized by a first height and a first width. The first height is less than the first depth. In addition, the partially process integrated circuit includes a via plug being positioned within the via plug position. The via plug is characterized by a first height. The first height is less than then first depth. Additionally, the partially process integrated circuit includes an oxide layer overlaying the via plug position. The oxide layer includes a filling portion and a blanket portion. The first portion is positioned within the first via opening and overlaying the via plug. The blanket portion overlays the first via opening. The blanket portion is characterized by a second width, wherein the second width is greater than the first width. Furthermore, the partially process integrated circuit includes a photoresist layer overlaying the oxide layer. The photoresist layer includes at least one opening. The at least opening is characterized by a third width, wherein the third width is greater than the first width.

It is to be appreciated that uniformity of depth on a semiconductor according to the present invention reduces the DUO loading effect. Among other things, the present invention reduces the DUO loading effect by reducing pattern diversity in integrated circuits. It is also to be appreciated that the present invention has a wide range of application. For example, the present invention allows better uniformity and consistency in semiconductor fabrication.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device for the etching process for the manufacture of integrated circuits. Merely by way of example, the invention has been applied to dual-damascene formation. But it would be recognized that the invention has a much broader range of applicability.

In the past, conventional techniques have been using deep ultraviolet light absorbing oxide (DUO) materials to fill via during the manufacturing process. For example, the DUO material is used in this application as a sacrifice layer. One of the challenge associated with using the DUO material is to reduce or eliminate loading effect caused by pattern diversity. Unfortunately, conventional techniques are often inadequate for many manufacturing needs of semiconductors. For example, DUO material used in conventional techniques often cause too much loading effect.

According to conventional techniques, DUO layer thickness and uniformity is an important characteristic during the damascene processes. Typically, the DUO layer thickness in via pattern area is less than the thickness at blank area for partial DUO filling in the via. This difference in thickness usually large when the via are deep and dense. For example, the differences in DUO layer thickness can be above 1200A. The difference in DUO layer thickness poses many problems in semiconductor manufacturing. Therefore, is it desirable to have an technique to eliminate or reduce to the difference in DUO layer thickness.

According to certain embodiments, the present invention reduce the difference in DUO layer thickness by using via plus during the semiconductor fabrication process. Among other things, the present invention reduces the loading effect caused by pattern diversity. The method and system according to the present inventions are illustrated in FIGS. 1A-1I and described below. These diagrams are merely provide an example, which should not unduly limit the scope of the claims. One of ordinary skill in the art would recognize many variations, alternatives, and modifications. FIG. 1A-1I provides an example of for a dual damascene process implemented according to certain embodiments of the present invention. For example, the present invention provided a via plug during etching process to reduce loading effect. It is to be recognized that various steps described below can be added, removed, replaced, repeated, or partially overlapped for various applications and should not unduly limit the scope of the claims.

Figure 1A:
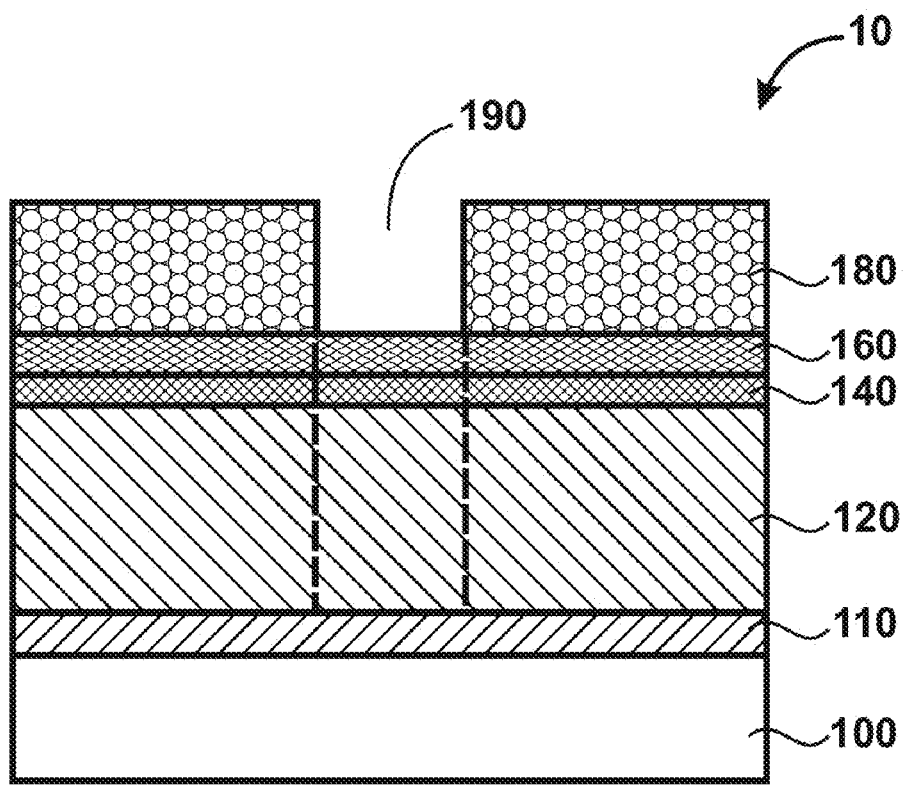
FIGS. 1A-1I are representative cross sectional side views of portions of a dual damascene structure at stages during the manufacturing process according to the present invention.

FIG. 1A is a simplified diagram illustrating a portion of a dual damascene structure to be processed according to an embodiment of the present invention. This diagram is merely an example, which should not unduly limit the scope of the claims. One of ordinary skill in the art would recognize many variations, alternatives, and modifications. A structure 10 includes a conductive region 100. The material of the conductive region 100 depends on the manufacturing process and the application. For example, the conductive region 100 is substantially made of copper. On top of the conductive region 100 overlays an insulating layer 110. On top of the insulating layer 110 is a inter metal dielectric (IMD) layer 120. For example, the IMD layer 120 is consisted of low-k carbon doped silicon dioxide. The structure 10 includes a stop layer (or hard mask layer) 140 above the IMD layer. For example, the stop layer 140 is consisted of silicon nitride (e.g., $Si_3N_4$) or silicon oxynitride (e.g., SiON). On top of the stop layer 140 is a bottom anti-reflective coating (BARC) layer 160. For example, BARC layer 160 is typically made of organic materials to reduce undesired light reflections in a subsequent photolithographic patterning process to define via openings. As illustrated according to FIG. 1A, the via openings include the via pattern 190. On top of the BARC layer 160 is a photoresist (PR) layer 180. Depending upon applications, certain types of PR layers can be used. For example, a deep ultraviolet (DUV) photoresist is used for patterning the via openings including an activating radiation source with a wavelength of less than about 250 nm, to expose the photoresist layer 180. As merely an example, the photoresist layer 180 can be any conventional DUV photoresist including, for example, a chemically amplified resist including a photogenerated acid. Other materials may be used for the PR layer as well. For example, commercially available photoresists include, PMMA and polybutene sulfone.

Figure 1B:
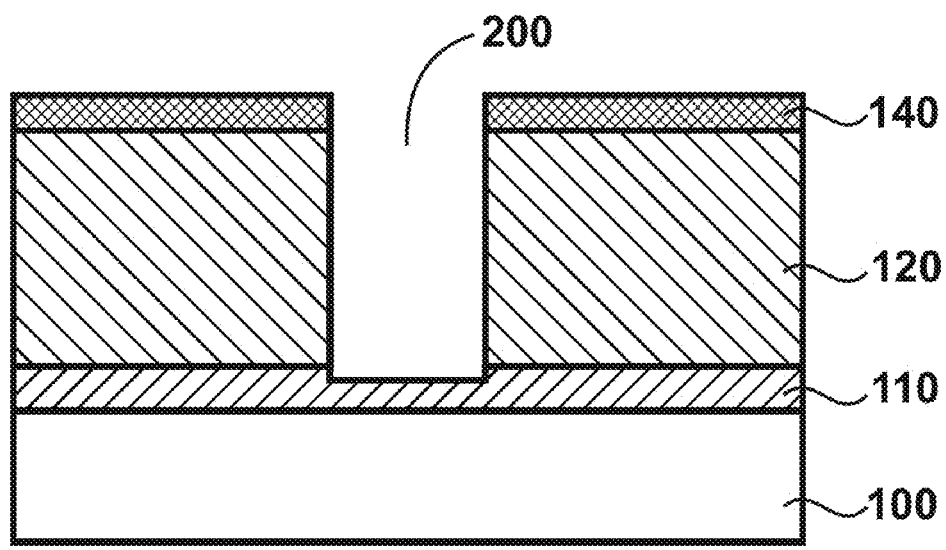

According to certain embodiment, the structure 10 is prepared to for etching. For example, a via pattern 190 is to be formed through the etching process. FIG. 1B is a simplified diagram illustrating a partially processed semiconductor material according to an embodiment of the present invention. This diagram is merely an example, which should not unduly limit the scope of the claims. One of ordinary skill in the art would recognize many variations, alternatives, and modifications. As illustrated according to FIG. 1B, the structure 10 has been partially processed. After some processing, the structure 10 includes a via opening 200, which is anisotropically etched through a thickness of the BARC layer 160, the stop layer 140, and the IMD layer 120 to create an opening in closed communication with the underlying conductive region 100. For example, the anisotropic etching is typically carried out by a conventional plasma reactive ion etching (RIE) process. Following the anisotropic etching, the photoresist layer 180 and BARC layer 160 are removed. For example, the photoresist layer 180 and the BARC layer 160 can be removed by wet chemical process a plasma etching process.

Figure 1C:
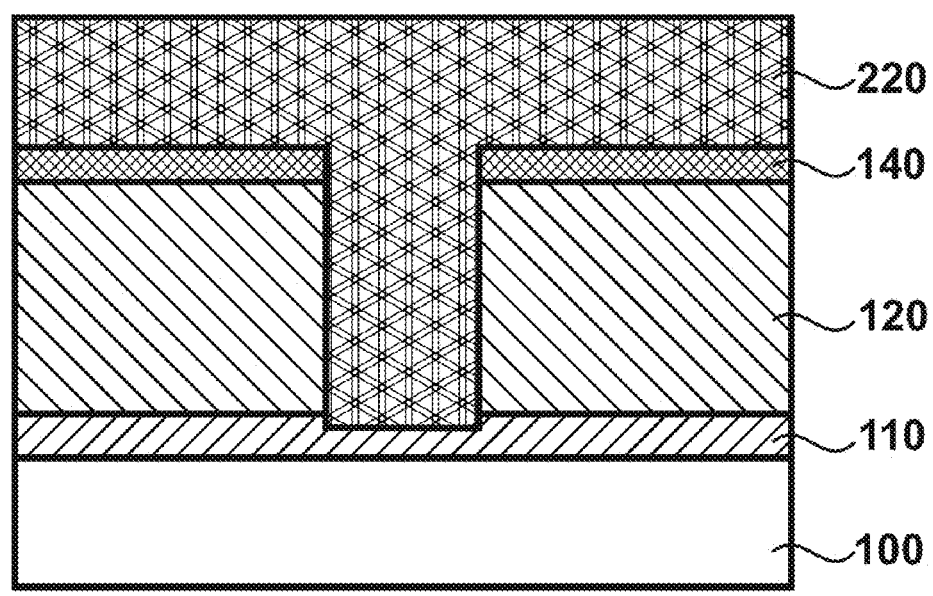

Typically, conventional techniques fills the via opening again to prepare for a second etching process. In contrast, according to certain embodiment of the present invention, addition process is performed to form a via plug that can be used to eliminate or reduce loading effect. FIG. 1C is a simplified diagram illustrating the deposition of a certain material to a partially processed semiconductor according to an embodiment of the present invention. This diagram is merely an example, which should not unduly limit the scope of the claims. One of ordinary skill in the art would recognize many variations, alternatives, and modifications. As illustrated according to FIG. 1C, a sacrificed layer 220 is conformally deposited over the via opening 200 of the structure 10. As merely an example, the sacrificed layer 220 is flowable organic and consisted of a photoresist material, which can be the same DUV photoresist material that is used for subsequently patterning trench line openings. According to certain embodiment, spin coating process may be used to apply photosensitive resinous materials to form the sacrificed layer 220.

Figure 1D:
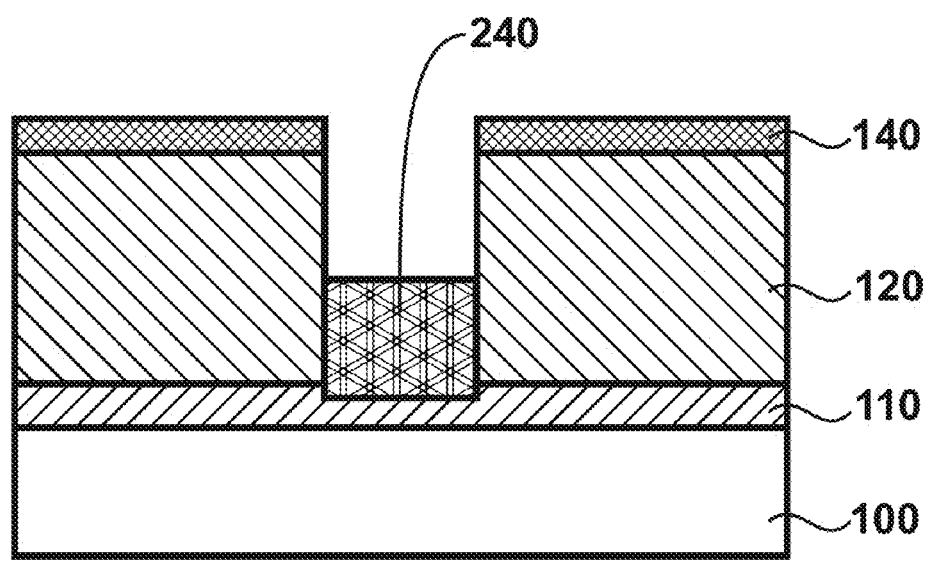

The sacrificed layer 220 is used to produce a via plug that can be used to eliminate or reduce loading effect. According to various embodiments, parts of the sacrificed layer 220 is removed. FIG. 1D is a simplified diagram illustrating processing of a sacrificed layer on a semiconductor to produce a via plug according to an embodiment of the present invention. This diagram is merely an example, which should not unduly limit the scope of the claims. One of ordinary skill in the art would recognize many variations, alternatives, and modifications. After the deposition of the sacrificed layer 220 as shown in FIG. 1C, the sacrificed layer 220 is etched and to partially removed. Depending upon the etching process, a large or small portion of the sacrificed layer 220 is removed. As a result, a via plug 240 is formed. The size of the via plug 240 varies depending on application. The via plug 240 fills part or all of the via opening 200. For example, the via plug 240 extends above a bottom portion of a subsequently etched trench line opening. For example, during the etch-back procedure, the etching depth is preferably close to the subsequent trench depth. The etch-back is carried out such that the via opening 200 remains at least partially filled to include at least partially covering the via sidewalls to form via plug 240 as shown in FIG. 1D. As merely an example, the etch-back process is carried out by a conventional RIE process.

Figure 1E:
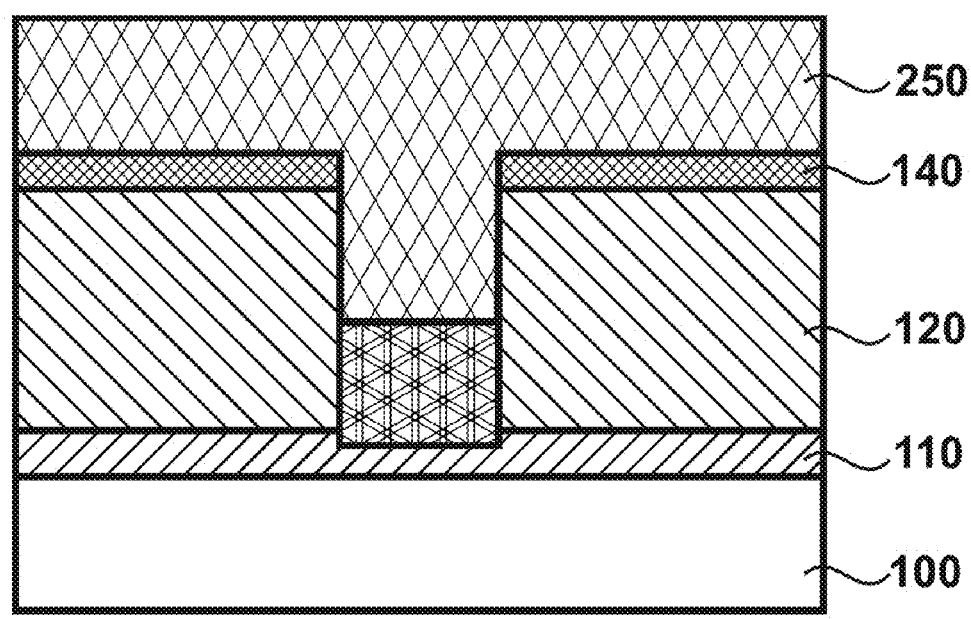

Typically, a DUO layer is used during the dual damascene process for an etching process that produces a second via opening, which is different from the first via as described earlier. The DUO layer is usually used to reduced to reduce or eliminate loading effect. However, it is to be appreciated that DUO layers alone are often inadequate. FIG. 1E is a simplified diagram illustrating a DUO layer deposited on partially processed semiconductor according to an embodiment of the present invention. This diagram is merely an example, which should not unduly limit the scope of the claims. One of ordinary skill in the art would recognize many variations, alternatives, and modifications. As illustrated on FIG. 1E, a DUO layer 250 is conformally deposited over the via plug 240 to fill the rest of the via opening 200. As merely an example, a conventional spin coating process is be used to form the DUO layer 250. As described above, the purpose of DUO layer 250 is to eliminate or reduce loading effect, and is not used for the etching process itself. Photoresist material is needed to form a via pattern.

Figure 1F:
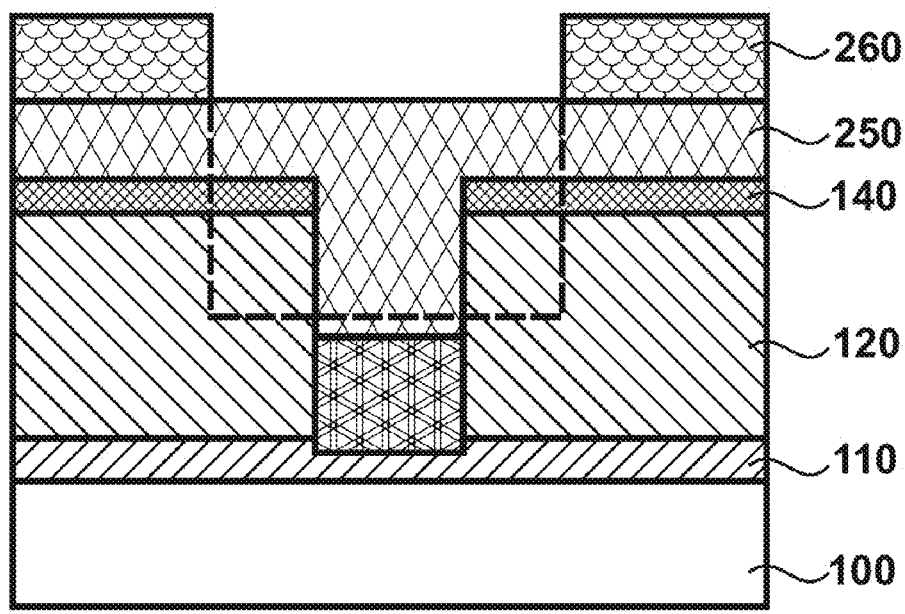

FIG. 1F is a simplified diagram illustrating a photoresist layer formed on top of a partially processed semiconductor material according to an embodiment of the present invention. This diagram is merely an example, which should not unduly limit the scope of the claims. One of ordinary skill in the art would recognize many variations, alternatives, and modifications. On top the DUO layer 250, a photoresist layer 260 (e.g., trench line photoresist) is deposited over the DUO layer 250. For example, the photoresist layer 260 is photolithographically patterned by exposure and development to form a pattern for trench line formation over the DUO layer 250. According to certain embodiments, the photoresist is a DUV photoresist that is designed for exposure and development. For example, the photoresist is designed for etching process involving a wavelength of less than about 250 nm. As an example, the photoresist layer 260 material is similar to the via plug 240 material.

Figure 1G:
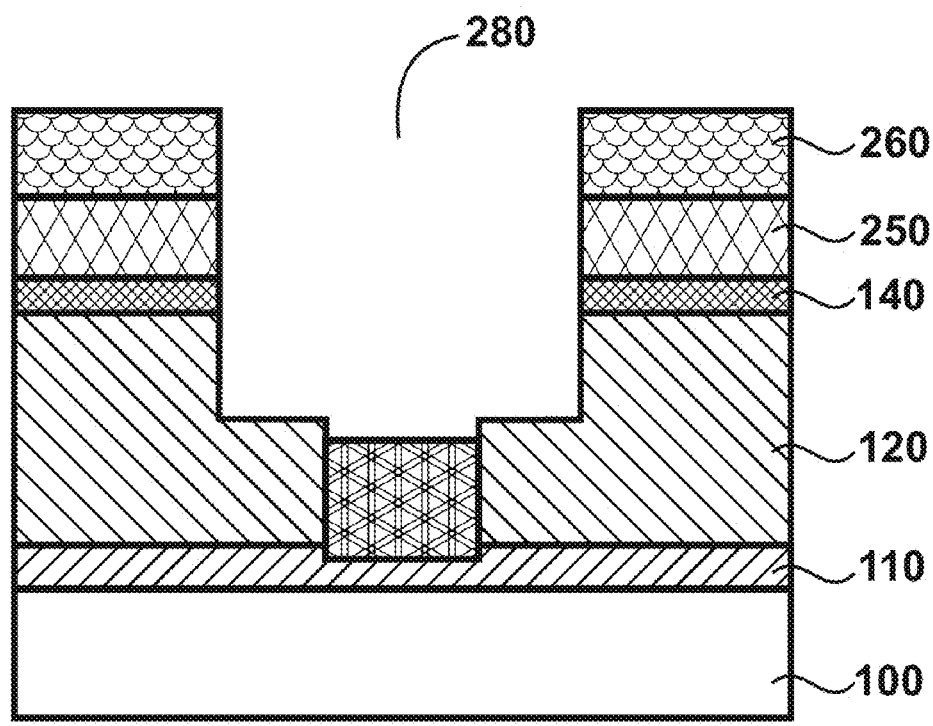

After the photoresist layer 260 is formed, the structure 10 is ready to be etched again. FIG. 1G is a simplified diagram illustrating a partially processed semiconductor that have been etched more than twice according to an embodiment of the present invention. This diagram is merely an example, which should not unduly limit the scope of the claims. One of ordinary skill in the art would recognize many variations, alternatives, and modifications. An etching process is used to etch through the DUO layer 250, the stop layer 140, a part of the via plug 240, and a part of the IMD layer 120. As a result of the etching process, a via opening 280 is formed. According to certain embodiments, a conventional etching process is used. For example, a plasma anisotropic etching process is used.

Figure 1H:
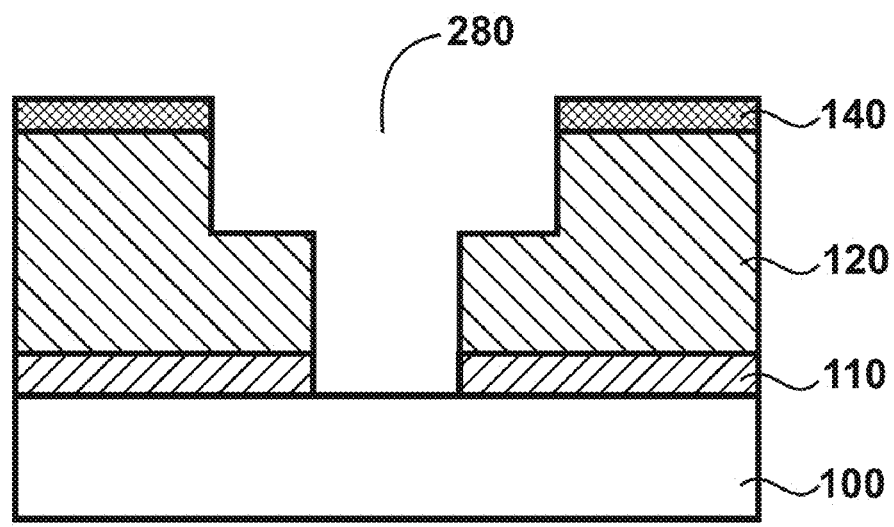

After the etching process, the photoresist layer and the partially etched via plug 240 are to be removed. FIG. 1H is a simplified diagram illustrating a partially processed semiconductor after the removal of photoresist and via plug according to an embodiment of the present invention. This diagram is merely an example, which should not unduly limit the scope of the claims. One of ordinary skill in the art would recognize many variations, alternatives, and modifications. During the removal process, both the photoresist and the via plug are removed from the structure 10. As a result, a cleaning via opening is formed. According to certain embodiments, the photoresist layer and the via plug are made of substantially the same material and thus are easily removed at the same time. For example, RIE ashing and cleaning process performed with an oxygen-rich plasma to remove the via plug 240 and the photoresist layer 260.

Figure 1I:
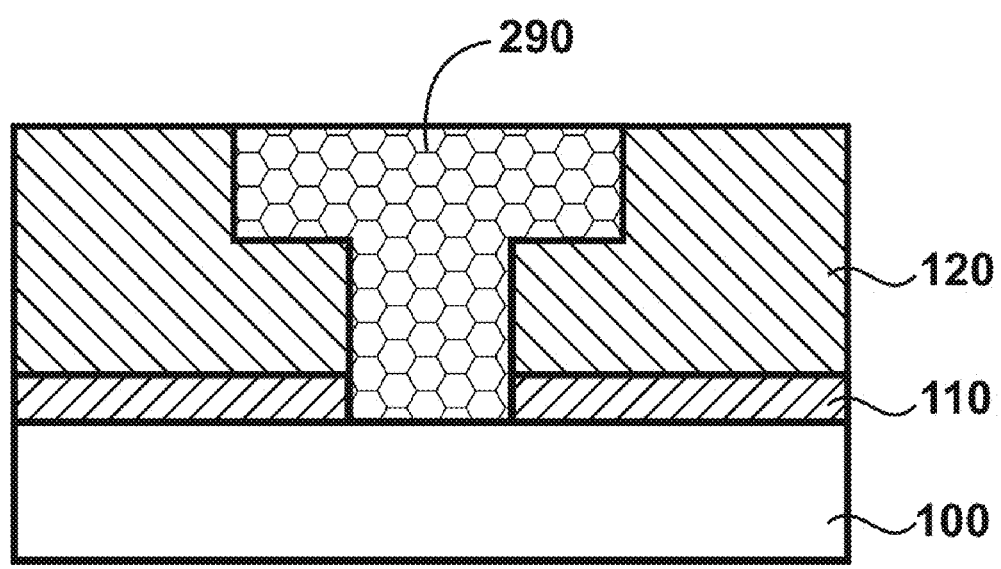

Typically, a dual damascene structure is completed in forming a barrier layer over the floor and sidewalls of the trench line opening 280 and via opening 200 followed by filling with a metal. For example, copper is filled into the opening. For certain application, a chemical mechanical polishing (CMP) process is performed for planarizing as shown in FIG. 1I.

Figure 2:
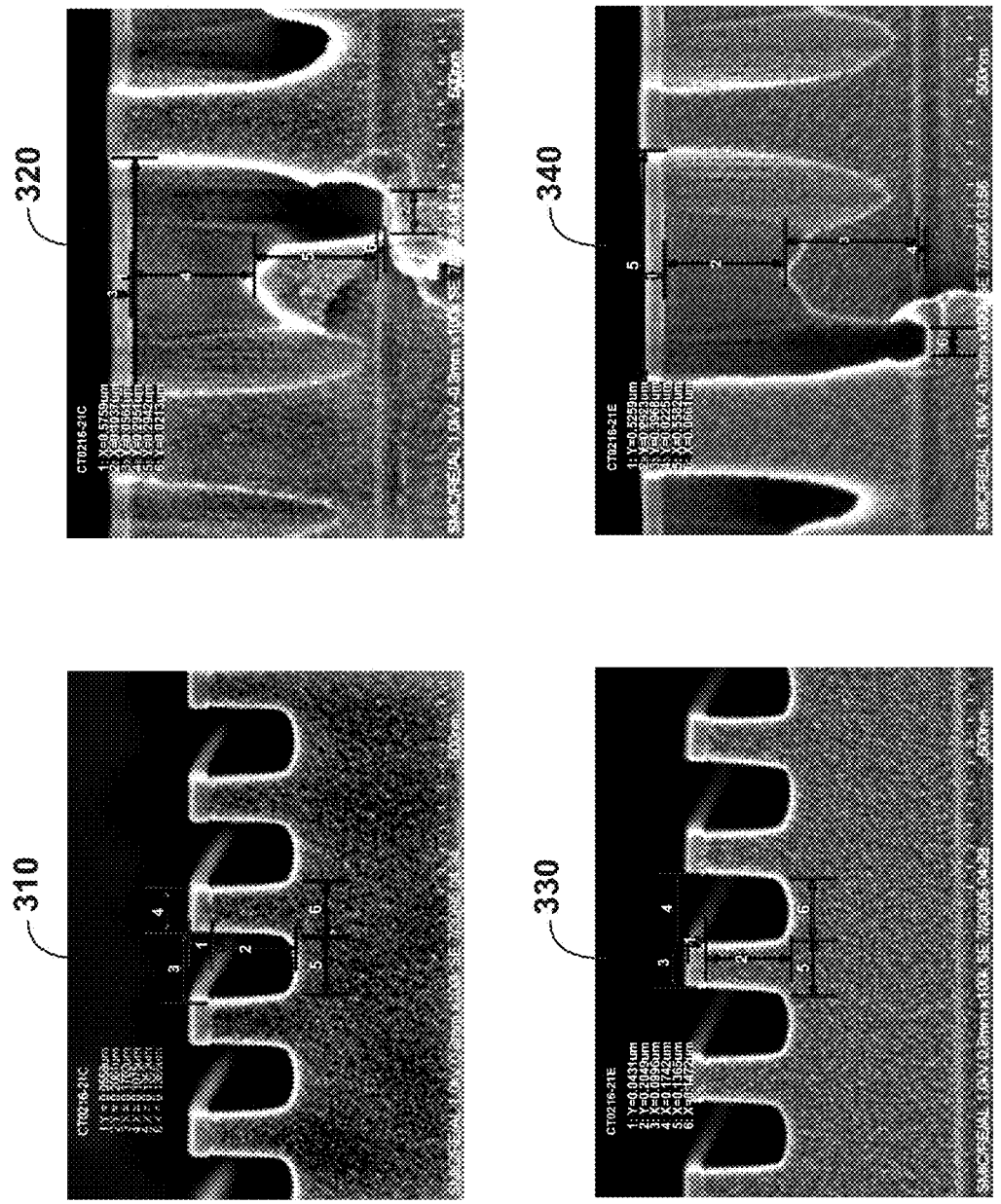
FIG. 2 includes images of a partially processed integrated circuit using conventional method.
Figure 3:
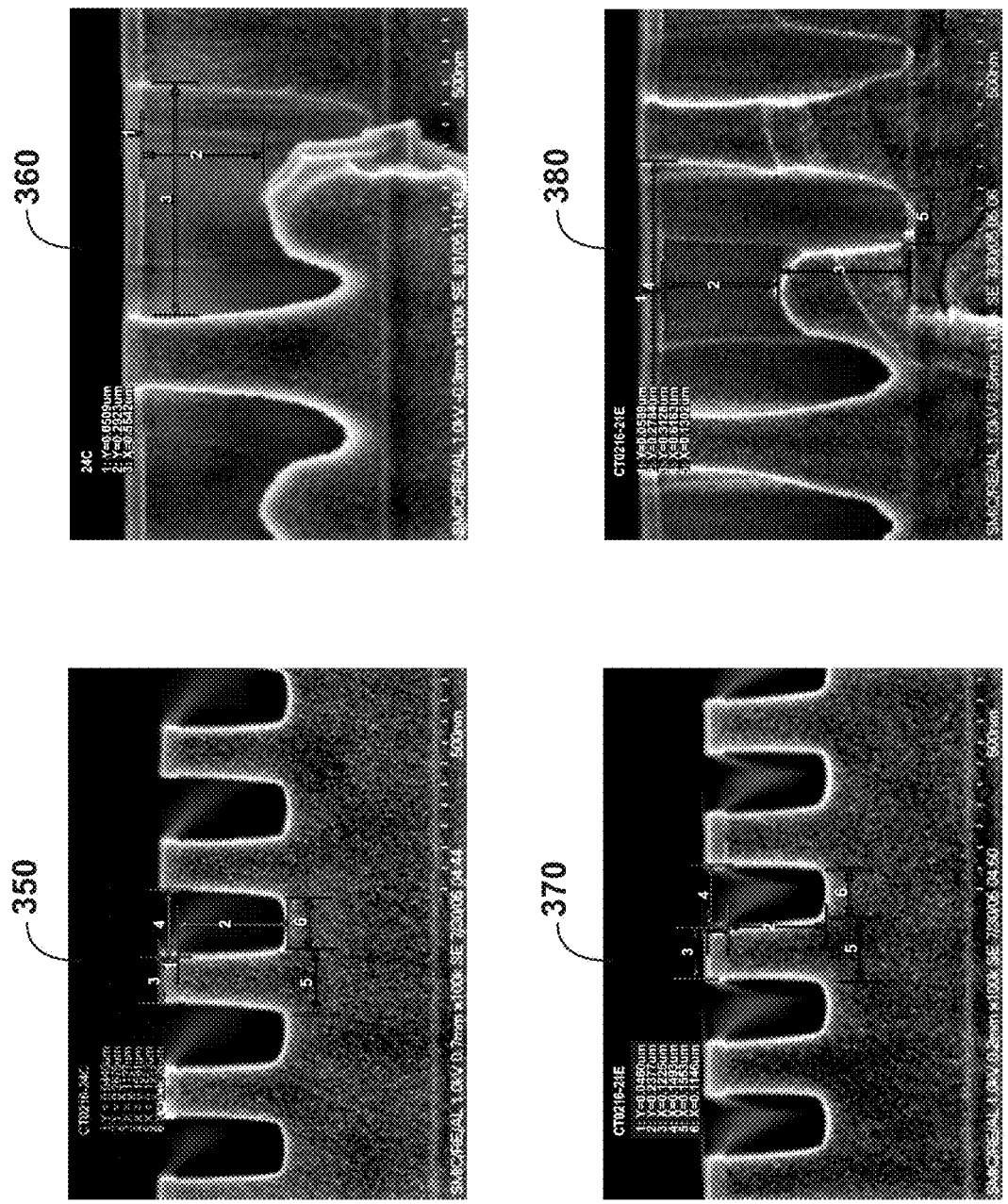
FIG. 3 includes images of a partially processed integrated circuit produced according to an embodiment of the present invention.

To illustrate the benefit and advantages of the present invention, FIGS. 2 and 3 illustrates experimental results comparing the etching depths. FIG. 2 includes images of a partially processed integrated circuit using conventional method. More specifically, image 310 shows etched wafer near the center of the wafer. The image 320 shows dual damascene etching near the center of the wafer. The image 330 shows etched wafer near the center of the wafer. The image 340 shows dual damascene etching near the edge of the wafer. During an experiment, the difference between the dual damascene depth and etching near the center of the wafer is measured at 953 angstroms. The difference between the dual damascene depth and etching near the center of the wafer is measured at 972 angstroms. The etch depth range is measured at 1032 angstroms.

It is to be appreciated that according various embodiments, the present invention provides a much more uniform etching depth. FIG. 3 includes images of a partially processed integrated circuit produced according to an embodiment of the present invention. These images are merely provide an example, which should not unduly limit the scope of the claims. One of ordinary skill in the art would recognize many variations, alternatives, and modifications. More specifically, image 350 shows etched wafer near the center of the wafer. The image 360 shows dual damascene etching near the center of the wafer. The image 370 shows etched wafer near the center of the wafer. The image 380 shows dual damascene etching near the edge of the wafer. During an experiment, the difference between the dual damascene depth and etching near the center of the wafer is measured at 317 angstroms. The difference between the dual damascene depth and etching near the center of the wafer is measured at 536 angstroms. The etch depth range is measured at 595 angstroms.

As the experimental data and images illustrate, the present invention provides a better uniformity in etching depth as compared to conventional techniques. To provide a better comparison between an embodiment of the present invention and a conventional technique, the Table 1 is present below.

TABLE 1

| after | | | loading (A) | |
|---|---|---|---|---|
| DUO clean (DNS) | WAT Depth (Å) | DD Depth (Å) | DD depth – WAT depth | etch depth Range (MAX-MIN) |
| #21 (BL) C | 2559 Å | 3512 Å | 953 Å | 1032 Å |
| E | 2480 Å | 3452 Å | 972 Å | |
| #24 (with C | 3115 Å | 3432 Å | 317 Å | 595 Å |
| via plug) E | 2837 Å | 3373 Å | 536 Å | |

According to an embodiment, the present invention provides a method of processing an integrated circuit wherein a loading effect is reduced. The method includes a step for providing a substrate, which is characterized by a first thickness. The method also includes a stop for forming an inter metal dielectric layer overlaying the substrate. The inter metal dielectric layer is characterized by a second thickness. The method additionally includes a step for forming a first photoresist layer overlaying the inter metal dielectric layer. The first photoresist layer is associated with a first pattern. Additionally, the method includes a step for forming a first via opening positioned at least partially inside the inter metal dielectric layer. The first via opening is characterized by a first depth. The method additionally includes a step for removing the first photoresist layer. The method further includes a step for forming a via plug. The via plug is positioned in side the first via opening. The via plug is characterized by a first plurality of dimensions. The first plurality of dimensions includes a first height and a first width. The first height is less than or equal to the first depth. Furthermore, the method includes a step for forming an oxide layer overlaying the first via opening. Additionally, the method includes a step for forming a second photoresist layer overlaying the oxide layer. The second photoresist layer is associated with a second pattern. The method also includes a step for forming a second via opening positioned at least partially inside the inter metal dielectric layer. The second via opening is characterized by second plurality of dimensions. The second plurality of dimensions includes a second depth and a second width. The second depth is less than the first depth. The second width is less then the first width. The method also includes a step for removing the via plug and the second photoresist layer. For example, the embodiment is illustrated by FIGS. 1A-1I.

According to another embodiment, the present invention provides a partially process integrated circuit. The partially process integrated circuit includes a substrate, which is characterized by a first dimension. The partially process integrated circuit also includes an inter metal dielectric layer overlaying the substrate. The inter metal dielectric layer includes a first via opening. The first via opening is characterized by a first depth. The partially process integrated circuit additionally includes a via plug position within the first via opening. The via plug position is characterized by a first height and a first width. The first height is less than the first depth. Additionally, the partially process integrated circuit includes a filling layer overlaying the via plug position. The filling layer includes a filling portion and a blanket portion. The filling portion is positioned within the via plug position. The blanket portion is characterized by a second width. The second width is greater than the first width. For example, the embodiment is illustrate by FIG. 1E.

According yet another embodiment, the present invention provides a partially process integrated circuit. The partially process integrated circuit includes a substrate, which is characterized by a first dimension. The partially process integrated circuit also includes an inter metal dielectric layer overlaying the substrate. The inter metal dielectric layer includes a first via opening. The first via opening is characterized by a first depth. The partially process integrated circuit additionally includes a via plug position within the first via opening. The via plug position is characterized by a first height and a first width. The first height is less than the first depth. In addition, the partially process integrated circuit includes a via plug being positioned within the via plug position. The via plug is characterized by a first height. The first height is less than then first depth. Additionally, the partially process integrated circuit includes an oxide layer overlaying the via plug position. The oxide layer includes a filling portion and a blanket portion. The first portion is positioned within the first via opening and overlaying the via plug. The blanket portion overlays the first via opening. The blanket portion is characterized by a second width, wherein the second width is greater than the first width. Furthermore, the partially process integrated circuit includes a photoresist layer overlaying the oxide layer. The photoresist layer includes at least one opening. The at least opening is characterized by a third width, wherein the third width is greater than the first width. For example, the embodiment is illustrate by FIG. 1F.

It is to be appreciated that uniformity of depth on a semiconductor according to the present invention reduces the DUO loading effect. Among other things, the present invention reduces the DUO loading effect by reducing pattern diversity in integrated circuits.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A partially processed integrated circuit comprising:
   a substrate, the substrate being characterized by a first dimension;
   an inter metal dielectric layer overlaying the substrate, the inter metal dielectric layer including a first opening, the first opening being characterized by a first depth;
   a stop layer overlaying the inter metal dielectric layer;
   a via plug position within the first opening, the via plug position being characterized by a first height and a first width, the first height being less than the first depth; and
   a filling layer overlaying the via plug position, the filling layer including a filling portion and a blanket portion, the filling portion being positioned within the via plug position, the blanket portion directly overlaying the stop layer and being characterized by a second width, the second width being greater than the first width.

2. The partially processed integrated circuit of claim 1 wherein the filling layer comprises photoresist material.

3. The partially processed integrated circuit of claim 1 wherein the inter metal dielectric layer comprises silicon dioxide.

4. The partially processed integrated circuit of claim 1 wherein the inter metal dielectric layer is doped with carbon.

5. The partially processed integrated circuit of claim 1 wherein the substrate comprises essentially pure silicon.

6. A partially processed integrated circuit comprising:
   a substrate, the substrate being characterized by a first dimension;
   an inter metal dielectric layer overlaying the substrate, the inter metal dielectric layer including a first opening, the first via opening being characterized by a first depth;
   a stop layer overlaying the inter metal dielectric layer;
   a via plug being positioned within the first opening, the via plug being characterized by a first height, the first height being less than then first depth;
   an oxide layer including a filling portion and a blanket portion, the filling portion being positioned within the first opening and overlaying the via plug, the blanket portion directly overlaying the stop layer, the blanket portion being characterized by a second width, wherein the second width is greater than the first width; and
   a photoresist layer overlaying the oxide layer, the photoresist layer including at least one opening, the at least one opening being characterized by a third width, wherein the third width is greater than the first width.

7. The partially processed integrated circuit of claim 6 wherein the via plug comprises photoresist material.

8. The partially processed integrated circuit of claim 6 wherein the inter metal dielectric layer comprises silicon dioxide.

9. The partially processed integrated circuit of claim 6 wherein the inter metal dielectric layer is doped with carbon.

10. The partially processed integrated circuit of claim 6 wherein the oxide layer includes DUO material.

* * * * *